April 29, 1969 W. B. HARRIS 3,441,873

THYRISTOR SWITCH CIRCUIT HAVING DIODE CONTROLLED FIRING MEANS

Filed Aug. 11, 1967

INVENTOR
W. B. HARRIS
BY
B. F. Stoddard
ATTORNEY

United States Patent Office 3,441,873
Patented Apr. 29, 1969

3,441,873

THYRISTOR SWITCH CIRCUIT HAVING DIODE CONTROLLED FIRING MEANS

William B. Harris, Bernardsville, N.J., assignor to Bell Telephone Laboratories, Incorporated, Murray Hill and Berkeley Heights, N.J., a corporation of New York Filed Aug. 11, 1967, Ser. No. 659,954
Int. Cl. H03b 5/12
U.S. Cl. 331—107 4 Claims

ABSTRACT OF THE DISCLOSURE

Square wave generators based on multivibrator circuits generally require two tubes or transistors for repetitively triggering one from the other. It has been discovered that a switch circuit employing a single thyristor with resonant turn-off means and reverse current diodes can be adapted to function as an astable oscillator by connecting a battery between the diodes and the gate of the thyristor. The fall time of a pulse produced by this switch circuit can be materially shortened by employing a serially connected resistor and a step recovery diode in parallel with the load circuit.

*Background of the invention*

This invention relates to improved semiconductor switch circuits capable of operating at rapid speeds in high power circuits for producing rectangular pulses having fast fall times.

Semiconductor switches of the prior art have generally used four-layer PNPN devices known as silicon controlled rectifiers or thyristors. As is well known, a PNPN device is usually provided with three terminals and has properties somewhat analogous to a gas-filled thyratron and, like the thyratron, once it is switched on, it remains conductive until a turn-off device is operated. Although the operating speed of the thyristor is inherently much greater than that of the thyratron, some utilization circuits require faster operating speeds than those for which a thyristor is inherently capable.

The need for faster operating speeds has been met by a prior art thyristor switch circuit which is disclosed and claimed in a copending patent application filed by W. B. Harris, R. P. Massey and F. J. Zgebura. This prior application, bearing Ser. No. 537,544, was filed on Mar. 25, 1966, and is assigned to the same assignee as the present application. The circuit of this copending application is described in detail hereinafter with reference to FIG. 1 of the drawings wherein it can be seen that the switch circuit employs a single thyristor and a conventional reverse current resonant turn-off circuit. An impedance is connected between the gate and cathode of the thyristor to reduce false triggering from the rate effect. Both the rate effect and the turn-off capabilities are improved by connecting a diode between the gate and cathode of the thyristor, and another diode between the gate and anode of the thyristor. These diodes, which may be called reverse current diodes, are so constructed that the reverse recovery time of the middle junction in the thyristor is less than that of the first diode and greater than that of the second diode.

Although this prior art circuit has made it possible to reduce the turn-off time of a thyristor switch to one-half or less of its inherent turn-off time, it is not fully satisfactory for all purposes. The reason for this is that a pulse produced by this switch circuit has a relatively slow fall time due to the capacity effect inherent in the load, or utilization circuit, and also to residual energy stored in the turn-off circuit.

Another objection is that, when this switch circuit is used as a free-running square wave oscillator or multivibrator, it has heretofore been necessary to add a second thyristor or transistor to the circuit for continuously or repetitively triggering one thyristor from the other.

*Summary of the invention*

The present invention is designed to improve the above-identified prior art switch circuit by overcoming the objections discussed above. Accordingly, the primary object of this invention is to modify the above-mentioned switch circuit so that its single thyristor will function as a free-running square wave generator or multivibrator without requiring a second thyristor or transistor and without employing an external source of trigger pulse current. Another object of the invention is to adapt this modified switch circuit for materially shortening the fall time of each pulse that it generates.

The first of these objects is attained by repetitively firing the single thyristor with current from a low voltage, direct current, power supply source that is incorporated in the switch circuit. In an exemplary embodiment of the invention, this power source is provided by a battery that is connected between the reverse current diodes and the gate terminal of the thyristor. At least one of the diodes functions to control the application of current from the battery to the gate terminal.

Specifically, when this diode is open, current from the battery is forced to flow to the gate terminal thereby turning on the thyristor and initiating the leading edge of a pulse of current. The thyristor is soon turned off by the resonant turn-off circuit thus producing the trailing edge of the pulse. At this time, the above-mentioned diode is closed due to a charge being stored in it. This causes the diode to function as a shunt across the gate-cathode circuit of the thyristor so that no current from the battery will flow to the gate terminal. When the diode recovers and again becomes open, current from the battery will be reapplied to the gate terminal and the process will be repeated.

Accordingly, the "ON" time of the thyristor is determined by the period of the resonant turn-off circuit and its "OFF" time is fixed by the reverse recovery time of the above-mentioned diode. The frequency of the pulses thus repetitively generated by the thyristor will be the sum of the "ON" time and the "OFF" time. Therefore, the switch circuit of this invention will function to generate a train of square wave pulses even though it has only one thyristor and does not employ an external source of trigger pulse current.

The second of the above-mentioned objects is accomplished by connecting across the load resistor a circuit comprising a resistor in series with a step recovery diode. The connections from the resonant turn-off circuit are modified so that one of its leads extends to a point that is connected between the step recovery diode and its resistor. The abrupt reverse step of the step recovery diode is utilized for terminating each pulse in a sudden fall time.

*Brief description of the drawing*

The features of this invention are fully discussed hereinafter in relation to the following detailed description of the drawing in which.

*Detailed description*

Figure 1:
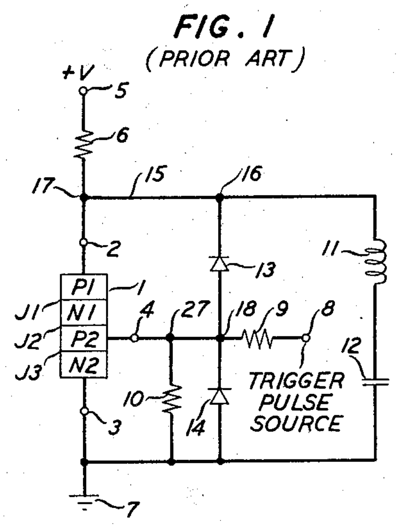
FIG. 1 (PRIOR ART)
FIG. 1 discloses the thyristor switch circuit of the above-mentioned copending application.

The switch circuit of the above-mentioned copending patent application is shown in FIG. 1 as utilizing a single thyristor 1 comprising four layers having regions P1, N1, P2, and N2 with junctions J1, J2, and J3 between them. The thyristor 1 is provided with an anode terminal 2 connected to the upper outer layer P1, a cathode terminal 3 connected to the lower outer layer N2, and a gate terminal 4 connected to the lower intermediate layer P2. A power supply source of direct voltage has its positive side connected to a terminal 5. The terminal 5 is coupled through a utilization circuit, which is represented symbolically by a load resistor 6, to the anode terminal 2. The cathode terminal 3 is connected to a source 7 of ground potential which is to be understood as being connected to the negative side of the source of direct voltage.

The switch circuit further includes a terminal 8 which extends to an external source of trigger pulse current. The terminal 8 is coupled through a resistor 9 and the points 18 and 27 to the gate terminal 4. A resistor 10 is connected between the point 27 and the source 7 of ground potential. As is well known in the art, a positive trigger pulse applied to the terminal 8 will cause current to flow through the divider resistors 9 and 10 thereby producing a potential difference between the gate terminal 4 and the cathode terminal 3. This functions to trigger the thyristor 1 by substantially reducing the impedance between the anode terminal 2 and the cathode terminal 3. The triggering of the thyristor 1 causes current to flow from the source 5 of positive direct voltage, through the load resistor 6, through the anode-cathode path in the thyristor 1 to the ground 7, and then back to the negative side of the direct voltage supply.

At this point, attention should be directed to a resonant turn-off circuit that comprises an inductor 11 and a capacitor 12 which are serially connected across the anode terminal 2 and the cathode terminal 3. Prior to the triggering of the thyristor 1, the capacitor 12 is charged to the same potential as that of the source 5 of direct voltage. When the thyristor is triggered, it becomes conductive and initiates the generation of a pulse across the load resistor 6. Also, at this time, the capacitor 12 discharges and initiates a flow of ringing current. The first half-cycle of this ringing current flows from the capacitor 12 through the inductor 11, over the lead 15, through the thyristor 1 in the forward direction and then back to the capacitor 12.

At the beginning of the second half-cycle, the ringing current reverses in phase and flows through the thyristor 1 in the reverse direction. The values of the capacitor 12 and the inductor 11 are so selected as to cause the magnitude of the reverse ringing current to quickly exceed the magnitude of the normal load current. This produces a net reverse current which flows from the cathode terminal 3, through all three of the junctions J3, J2, and J1, and then to the anode terminal 2.

In order to reduce the time required to restore the forward-blocking capability of the thyristor 1 and also to improve its dynamic breakdown capability, two diodes 13 and 14 are serially connected across the anode terminal 2 and the cathode terminal 3, and are also connected acros the inductor 11 and the capacitor 12. It can be seen in FIG. 1 that this connection uses the lead 15 for connecting a point 16 between the inductor 11 and the upper diode 13 to a point 17 between the load resistor 6 and the anode terminal 2. The point 18 between the diodes 13 and 14 is joined to the conductor extending from the gate terminal 4 to the resistor 9 and the terminal 8.

As is described in the above-mentioned copending application, the lower diode 14 has a reverse recovery time which is longer than the reverse recovery time of the middle junction J2 of the thyristor 1. Conversely, the upper diode 13 has a reverse recovery time which is less than the reverse recovery time of the junction J2. In other words, the reverse recovery time of the middle junction J2 is less than that of the lower diode 14 and is greater than that of the upper diode 13.

It should be noted that, at the beginning of the second half-cycle of the ringing current, the ringing current will be a reverse current or the two outer junctions J1 and J3 but will be a forward current for the middle junction J2. Therefore, the slow recovery diode 14 will be momentarily reverse biased by the charge stored in the lower junction J3 while the fast recovery diode 13 will be biased below its threshold voltage by the opposed charges in junctions J1 and J2. This condition of the diodes 13 and 14 permits the reverse ringing current to flow through the thyristor 1 at the start of the second half-cycle.

The flow of reverse ringing current quickly functions to reduce the charge density in junction J3 to zero thereby causing it to recover and open. During the transition in junction J3, current will begin to flow through the lower diode 14 and will increase to the point at which the diode 14 will be carrying all of the reverse ringing current. At this time, the reverse current will flow from the capacitor 12, through the lower diode 14, through the gate terminal 4 and into the middle junction J2, out through the upper junction J1, and then to the inductor 11. Thus, the recovery of the lower junction J3 does not terminate the pulse since the pulse current across the load resistor 6 is maintained because it is superimposed upon the reverse ringing current which is now flowing through the lower diode 14.

Since the reverse ringing current is also a reverse current for the upper junction J1, the junction J1 will partially recover during the time that the lower junction J3 is carrying reverse current. After the lower junction J3 fully recovers, the above-described flow of reverse current through the lower diode 14 and the middle junction J2 will force the upper junction J1 to complete its recovery thereby reducing its charge density to zero. In other words, the upper junction J1 is forced to recover due to a forward current flowing through the middle junction J2.

While this change in junction J1 is occurring, the current flowing through junctions J1 and J2 will be reduced toward zero and the current flowing through the fast recovery diode 13 will be correspondingly increased to the limit of the reverse ringing current. This flow of current through the upper diode 13 will cause an additional charge to be stored in the lower diode 14. It should be noted that, since the middle junction J2 had been forward biased, the charge density now existing in this junction J2 is not zero and it begins to recover by recombination. The thyristor 1 is now open at both junctions J1 and J3 and further reverse current is unnecessary except to store more charge in the slow recovery diode 14.

During the latter portion of the second half-cycle of ringing current, the magnitude of the ringing current becomes smaller than the magnitude of the load current, and, since the reverse recovery time of the upper diode 13 is less than the reverse recovery time of the middle junction J2, the diode 13 recovers and a second forward current is now applied to the thyristor 1. This current flows in the forward direction through the upper junction J1 and in the reverse direction through the middle junction J2 and the lower diode 14. Accordingly, this current forces the middle junction J2 to recover before the diode 14 recovers by recombination. The recovery of the middle junction J2 turns off the thyristor 1 thereby terminating the pulse. Shortly thereafter, when the diode 14 finally completes its recovery, the switch circuit becomes ready for generating another pulse.

By thus designing diode 14 to recover more slowly than the middle junction J2, gate triggering of the thyristor 1 is prevented, as is explained in the above-mentioned copending patent application, by providing a low impedance between the cathode terminal 3 and the gate terminal 4 for a short interval after the thyristor 1 recovers and thus improves the rate effect capability of this switch circuit.

Figure 2:
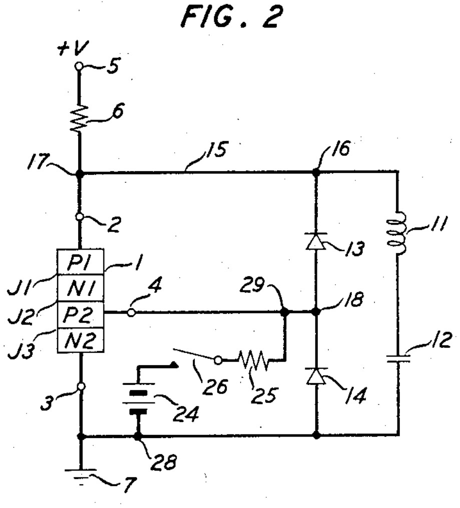
FIG. 2 shows the circuit of FIG. 1 modified in accordance with the present invention for functioning as a free-running square wave generator.

As was stated previously, when the above-described thyristor switch has been used as a free-running square wave oscillator or multivibrator, it has heretofore been necessary to add a second thyristor or transistor to the circuit in order to repetitively trigger one thyristor from the other. However, the necessity for using such a second thyristor is avoided by modifying the circuit of FIG. 1 in accordance with this invention as is illustrated in FIG. 2. Since the circuit of FIG. 2 is a modification of the circuit of FIG. 1, those elements of FIG. 2 that are the same as those in FIG. 1 are identified with the same reference designations.

When the circuit of FIG. 2 is compared with the circuit of FIG. 1, it can be seen that the resistor 9 and the terminal 8 have been omitted. It can also be seen that a low voltage battery 24, a resistor 25, and a manually operable "ON-OFF" switch 26 have been added and are connected in series between the points 28 and 29. As is indicated in the drawing, the battery 24 has its negative side or terminal connected to the point 28 and its positive side or terminal connected to the point 29. Thus, the battery 24, which constitutes a supply source of unvarying fixed potential, is connected between the gate and cathode terminals 3–4 of the thyristor 1 and is also connected in parallel with the slow recovery diode 14. During the idle condition, the control switch 26 is in its "OFF" position.

The thyristor circuit of FIG. 2 is normally open, as was the case with the circuit of FIG. 1, due to the relatively high impedance that now exists between the anode terminal 2 and the cathode terminal 3 of the thyristor 1. Since there is no conventional source of trigger pulse current in the circuit of FIG. 2, the circuit is put into operation by closing the switch 26 thereby applying positive current from the battery 24 through the resistor 25 to the point 29. At this time, the current from the battery 24 will not flow through the lower diode 14 because the diode 14 has its anode connected to the negative side of the battery 24 and is consequently reverse biased. Current from the battery 24 is also prevented from flowing through the upper diode 13 because the positive potential from the power source 5 is applied over the lead 15 and through the point 16 to the cathode of the diode 13. Therefore, the positive current from the battery 24 is now forced to flow to the gate terminal 4 of the thyristor 1 thereby triggering the thyristor 1 and starting the formation of the leading edge of a square wave pulse.

At this time, the capacitor 12, which had been charged by current from the power source 5, discharges and initiates a flow of ringing current through the inductor 11, over the lead 15, and through the thyristor 1 in the forward direction. During the second half-cycle of the ringing current, which, as was explained above, flows in the reverse direction, the fast recovery diode 13 functions in the manner described above for assisting the thyristor 1 to recover quickly its forward-blocking capability and to thereby terminate the generation of the square wave pulse. In this manner, the "ON" time of the thyristor 1 is determined by the period of the resonant turn-off circuit 11–12.

During the second half-cycle of ringing current, the flow of current through the fast recovery diode 13 causes an additional charge to be stored in the slow recovery diode 14 as was explained above. Accordingly, at the time when the thyristor 1 turns off, the diode 14 will be closed due to its stored charge. This acts as a shunt across the gate-cathode circuit of the thyristor 1 and permits current from the battery 24 to flow through the diode 14 in the reverse direction. For this reason, no current will be applied to the gate terminal 4 of the thyristor 1 at this time.

After the stored charge in the diode 14 has been depleted and the diode 14 has recovered by recombination, it ceases its reverse conduction and current from the battery 24 will again be forced to flow to the gate terminal 4 of the thyristor 1. This current again functions as triggering current for firing the thyristor 1 and thereby starting the generation of another pulse across the load resistor 6. It can thus be understood that the "OFF" time of the thyristor 1 is fixed by the reverse recovery time of the diode 14.

It should be noted that, during the time while the diode 14 was recovering by recombination, positive voltage from the power source 5 caused the capacitor 12 to become charged again. Accordingly, the second turning-on of the thyristor 1 will be terminated in the same manner as that described above and a charge will again be stored in the diode 14.

After the diode 14 completes its second recovery, it will again effect the application of current from the battery 24 to the gate terminal 4 of the thyristor 1 thereby initiating the generation of another pulse. As this procedure will be repeated continuously, it can be understood that the circuit of FIG. 2 will operate to repetitively generate a succession of square wave pulses without requiring a second thyristor and without employing an external source of trigger pulse current. In other words, this cicuit functions in the manner of an astable oscillator or multivibrator.

The cyclical generation of pulses produced by the circuit of FIG. 2 can be terminated when desired by simply opening the control switch 26.

It should be noted that the interpulse spacing or frequency of the pulses is the sum of the "ON" time and the "OFF" time which were defined above. The frequency of the pulses can be varied by suitably adjusting the values of one or more of the circuit components, such as the load resistor 6, the inductor 11, or the capacitor 12. In order to obtain equal "ON" and "OFF" times, the recovery time of the diode 14 should be approximately twice the reverse recovery time of the thyristor 1.

The switch circuits of FIGS. 1 and 2 each have in common the advantage of possessing a fast operating speed for producing pulses. However, they are not fully satisfactory for all purposes because a pulse produced by any one of these switch circuits has a relatively slow fall time due to the capacity effect inherent in the load and also to residual energy stored in the turn-off circuit. A substantially shorter fall time can be obtained by modifying these circuits in the manner shown in FIG. 3 to produce a more precisely rectangular wave with faster switching action. Since the thyristor switch circuit of FIG. 3 is a modification of the circuits of FIGS. 1 and 2, the same reference designations are used in each circuit for identifying elements that are common to all of them.

Figure 3:
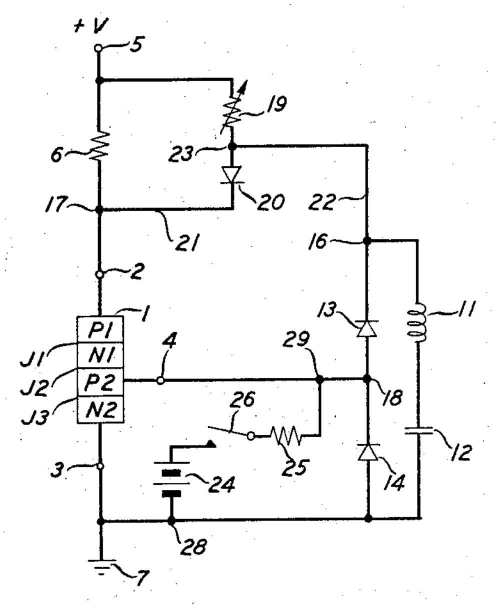
FIG. 3 illustrates the manner in which a step recovery diode is added to the circuit of FIG. 2 for substantially shortening the fall time of a pulse generated by this circuit.

When the circuit of FIG. 3 is compared with the other circuits, it can be seen that a significant distinction is that, in the circuit of FIG. 3, the utilization circuit, which is represented symbolically by the load resistor 6, is provided with a parallelly connected circuit comprising a serially connected variable resistor 19 and a diode 20. The diode 20 is of the type known to those skilled in the art as a step recovery diode or charge-storage diode. It is described by J. L. Moll, S. Krakauer, and R. Shen in an article, entitled "P-N Junction Charge-Storage Diodes," and published on pages 43 to 53, inclusive, of volume 50, No. 1, of the Proceedings of the IRE for January 1962. As is described in this article, this type of diode is designed to have finite carrier lifetime so as to conduct for a period of time in the reverse direction.

The junction of the diode 20 is built with retarding fields for minority carriers in order to constrain storage to the vicinity of the junction. When the stored minority carriers are depleted, a very abrupt step in current occurs. In other words, when the diode 20 recovers at the end of its storage time, it snaps off quickly thereby producing a sudden change in the current.

This steep reverse step is utilized in the circuit of FIG. 3 to determine the fall time of a pulse produced by the thyristor 1. In other words, the abrupt drop in the current through the diode 20 at the end of its storage, or reverse recovery time produces a corresponding fast fall time for a pulse generated by the thyristor 1. In addition, it should be noted that, in this circuit, the thyristor 1 functions in the manner of an amplifier to provide an output pulse having much more power than could be provided by the diode 20.

In connecting the step recovery diode 20 into the circuit of FIG. 3, the lead 15, which is shown in the other circuits to extend between the points 17 and 16, is omitted. The point 17 is now connected in FIG. 3 by a lead 21 to the cathode of the diode 20, and the point 16 is connected by a lead 22 to a point 23 between the resistor 19 and the anode of the diode 20. This circuit construction serves to couple the upper side of the resonant turn-off circuit through the diode 20 to the anode terminal 2 of the thyristor 1.

The thyristor circuit of FIG. 3 is normally open, as was the case with the circuits of FIGS. 1 and 2, due to the relatively high impedance that now exists between the anode terminal 2 and the cathode terminal 3. Since there is no conventional source of trigger pulse current in the circuit of FIG. 3, it is put into operation by closing the switch 26. This causes current from the battery 24 to flow through the resistor 25 to the gate terminal 4 thereby firing the thyristor 1 and starting the formation of a pulse.

The capacitor 12 now discharges and initiates a flow of ringing current through the induction 11 to the point 16, along the lead 22 to the point 23, through the step recovery diode 20, and then along the lead 21 to the anode terminal 2 of the thyristor 1. The total current that will now flow through the thyristor 1 will be the sum of the load current through the load resistor 6, the auxiliary current through the resistor 19, and the initial half-cycle of the ringing current. The latter two currents, during this first half-cycle, store charge in the step recovery diode 20.

The second half-cycle of the ringing current provides the reverse current for turning off the thyristor 1 and flows through the diodes 13 and 14, in the manner described above, while leaving the stored charge in the step recovery diode 20. Because of this stored charge, the pulse across the load resistor 6 is now maintained due to the pulse current across the load resistor 6 flowing in the reverse direction through the step recovery diode 20 and being superimposed upon the reverse ringing current. The pulse current continues to flow through the step recovery diode 20 until its stored charge is depleted. At this point, the diode 20 will recover by its snap action thereby producing the above-mentioned abrupt reverse step for terminating the pulse in a sudden fall time.

As the storage time of the step recovery diode 20 is an important factor in terminating a pulse produced by this switch circuit, it should be noted that this diode 20 is so constructed that its storage time, or recovery time, is no shorter than, and preferably is slightly longer than, the turn-off time, or forward-blocking recovery time, of the thyristor 1. In other words, the middle junction J2 in the thyristor 1 must recover by recombination before the diode 20 recovers by its snap action. Therefore, very shortly after the middle junction J2 recovers its forward-blocking capability, the step recovery diode 20 will recover thereby producing the above-mentioned abrupt reverse step which now functions to block any flow of current through the load resistor 6.

Therefore, a pulse generated by this switch circuit will be terminated in a sudden fall time corresponding to the abrupt reverse step of the diode 20. Thus, the fall time of a pulse produced by the circuit of FIG. 3 will be materially shorter than the fall time of a pulse generated by either of the circuits shown in FIGS. 1 and 2.

The termination of the pulse allows charging voltage to again be applied to the capacitor 12 over a path extending from the power supply source 5, through the resistor 19, along the lead 22 to the point 16, and then through the inductor 11 to the capacitor 12. After the diode 14 has recovered, it ceases its reverse conduction and current from the battery 24 will again flow to the gate terminal 4. This will again fire the thyristor 1 thereby starting the generation of another pulse across the load resistor 6.

Thus, the circuit of FIG. 3 functions in the manner of an astable oscillator to repetitively generate a train of square wave pulses with each pulse having a rapid fall time. The operation of the circuit of FIG. 3 is stopped in the same manner as that described above for the circuit of FIG. 2, namely, by opening the control switch 26.

What is claimed is:

1. A switch circuit adapted for generating a train of pulses,
   said switch circuit comprising only one thyristor,
   said thyristor being normally nonconductive and having a gate terminal adapted for receiving electric energy for turning it on,
   said thyristor also having a cathode terminal,
   a resonant turn-off circuit connected across said thyristor and adapted for producing electric energy for turning off said thyristor after it has been turned on,
   improving means for improving the rate effect capability of said thyristor,
   said improving means including a pair of serially connected diodes connected in parallel with said turn-off circuit,
   said switch circuit being characterized in that it further comprises firing means for repetitively applying electric energy to said thyristor for repetitively turning it on after it has been turned off,
   said firing means including a supply source of fixed unvarying potential,
   said supply source being constituted solely by a battery having a negative terminal and a positive terminal,
   connecting means for connecting said negative terminal to said cathode terminal,
   coupling means for coupling said positive terminal to said gate terminal,
   said coupling means being constituted only by resistive impedance means,
   said firing means further comprising means for controlling the application of current from said battery to said gate terminal,
   said last-mentioned means including control means for repetitively opening and closing a shunt path across said gate and cathode terminals of said thyristor for repeatedly interrupting the flow of current from said battery to said gate terminal,
   and said control means including one of said serially connected diodes.

2. A switch circuit in accordance with claim 1 wherein
   each of said diodes has an anode terminal and a cathode terminal with one of said diodes having a relatively fast reverse recovery time and the other of said diodes having a relatively slow reverse recovery time,
   and wherein said one diode included in said control means is the diode having a relatively slow reverse recovery time,
   and said control means further comprising biasing means for reverse biasing said one diode,
   said biasing means including means for connecting the anode terminal of said one diode to the negative terminal of said battery.

3. A switch circuit comprising a source of electric energy,
   a thyristor having anode and cathode terminals,
   a utilization circuit for coupling said source to said anode terminal,
   said thyristor being adapted for producing a pulse of electric energy across said utilization circuit,
   starting means for firing said thyristor for producing the leading edge of said pulse,
   said starting means including a gate terminal connected to said thyristor,
   and stopping means for turning off said thyristor for initiating the trailing edge of said pulse, said stopping means including a turn-off circuit connected to said anode and cathode terminals, said switch circuit being characterized in that it further comprises adapting means for adapting it to function as an astable oscillator for producing a train of pulses each being similar to said pulse, said adapting means including firing means for repetitively firing said thyristor after it has been turned off by said stopping means, said firing means including a second source of electric energy, said electric energy from said second source having a uniform unvarying potential, connecting means for connecting said second source to said cathode terminal and also to said gate terminal, and said switch circuit further comprising means for abruptly terminating said trailing edge of said pulse, said last-mentioned means including a step recovery diode having a cathode connected to said anode terminal of said thyristor, and said step recovery diode having an anode connected to said turn-off circuit and also to said second source of electric potential.

4. A switch circuit comprising a source of electric energy, a thyristor having anode and cathode terminals, a utilization circuit for coupling said source to said anode terminal, said thyristor being adapted for producing a pulse of electric energy across said utilization circuit, starting means for firing said thyristor for producing the leading edge of said pulse, said starting means including a gate terminal connected to said thyristor, and stopping means for turning off said thyristor for initiating the trailing edge of said pulse, said stopping means including a turn-off circuit connected to said anode and cathode terminals, said switch circuit being characterized in that it further comprises adapting means for adapting it to function as an astable oscillator for producing a train of pulses each being similar to said pulse, said adapting means including firing means for repetitively firing said thyristor after it has been turned off by said stopping means, said firing means including a second source of electric energy, said electric energy from said second source having a uniform unvarying potential, connecting means for connecting said second source to said cathode terminal and also to said gate terminal, at least one slow recovery diode connected across said anode and cathode terminals and also in parallel with said turn-off circuit for reducing the turn-off time of said thyristor, said diode having a cathode, means for connecting said second source of electric energy to said cathode of said diode, and said switch circuit further comprising means for abruptly terminating said trailing edge of said pulse, said last-mentioned means including a step recovery diode having a cathode connected to said anode terminal of said thyristor, said step recovery diode having an anode connected to said turn-off circuit, and means for coupling said step recovery diode to said second source of electric energy, said last-mentioned means including a fast recovery diode.

References Cited

UNITED STATES PATENTS

| | | | |
|---|---|---|---|
| 3,045,148 | 7/1962 | McNulty et al. | 331—111 |

JOHN KOMINSKI, *Primary Examiner.*

U.S. Cl. X.R.

331—117